United States Patent
McCrate et al.

(10) Patent No.: US 11,455,210 B1
(45) Date of Patent: Sep. 27, 2022

(54) ERROR DETECTION AND CORRECTION IN MEMORY

(71) Applicant: Micron Technology, Inc., Boise, ID (US)

(72) Inventors: Joseph M. McCrate, Boise, ID (US); Robert J. Gleixner, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/239,864

(22) Filed: Apr. 26, 2021

(51) Int. Cl.
*G06F 11/10* (2006.01)
*G11C 13/00* (2006.01)
*H03M 13/15* (2006.01)

(52) U.S. Cl.
CPC ........ *G06F 11/1076* (2013.01); *G11C 13/003* (2013.01); *G11C 13/004* (2013.01); *G11C 13/0004* (2013.01); *H03M 13/152* (2013.01); *G11C 2213/15* (2013.01)

(58) Field of Classification Search
CPC ............. G06F 11/1076; G11C 13/0004; G11C 13/003; G11C 13/004; G11C 2213/15; H03M 13/152
See application file for complete search history.

(56) References Cited

U.S. PATENT DOCUMENTS

| | | | | |
|---|---|---|---|---|
| 2003/0023923 | A1* | 1/2003 | Davis | G06F 11/1008 714/763 |
| 2005/0276129 | A1* | 12/2005 | Meihong | G11C 29/846 365/200 |
| 2017/0249207 | A1* | 8/2017 | Sharon | G11C 29/52 |
| 2019/0378566 | A1* | 12/2019 | Boniardi | G11C 11/54 |

OTHER PUBLICATIONS

R. Micheloni, Al, Marelli, R. Ravasio, "Error Correction Codes for Non-Volatile Memories", Chapter 10: Erasure Technique, 2008, pp. 249-267, Springer Netherlands, 19 pages.
S. Lin, D.J. Costello, "Error Control Coding", Section 6.6: Correction of Errors and Erasures, May 28, 2004, Pearson, p. 217, 1 page.
U.S. Appl. No. 16/869,059, entitled, "Two Memory Cells Sensed to Determine One Data Value," filed May 7, 2020, (61 pgs.).

* cited by examiner

*Primary Examiner* — Kyle Vallecillo
(74) *Attorney, Agent, or Firm* — Brooks, Cameron & Huebsch, PLLC (57) ABSTRACT

The present disclosure includes apparatuses, methods, and systems for error detection and correction in memory. An embodiment includes a memory having a group of self-selecting memory cells which store data corresponding to a codeword from an error correcting code, and circuitry configured to perform a sense operation on the group of self-selecting memory cells, identify, based on the sense operation, memory cells of the group that cannot store data, mark data sensed from the identified memory cells as erasures and perform an error correction operation on data sensed from the group of self-selecting memory cells with the data sensed from the identified memory cells marked as erasures.

23 Claims, 7 Drawing Sheets

|  | NEG WRITE | | | | | | | | | |
|---|---|---|---|---|---|---|---|---|---|---|
|  | SET | RST | SET | RST | SET | RST | SET | RST | SET | RST |
| FAIL TYPE | NONE | NONE | OPEN (CELL) | OPEN (CELL) | SHORT (CELL) | SHORT (CELL) | SHORT (BOT) | SHORT (BOT) | SHORT (TOP) | SHORT (TOP) |
| NEG READ VALUE | 1 | 0 | 0 | 0 | 1 | 1 | 1 | 1 | 0 | 0 |
| POS READ VALUE | 0 | 1 | 0 | 0 | 1 | 1 | 0 | 0 | 1 | 1 |
| BIPOLAR READ ERASURE |  |  | X | X | X | X |  |  |  |  |
| NEG SHORT DETECT | 0 | 0 | 0 | 0 | 1 | 1 | 1 | 1 | 0 | 0 |
| UNIPOLAR SHORT ERASURE |  |  |  |  |  | X | X | X |  |  |
| POS SHORT DETECT | 0 | 0 | 0 | 0 | 1 | 1 | 0 | 0 | 1 | 1 |
| BIPOLAR (NEG + POS) SHORT ERASURE | 0 | 0 |  |  | X | X | X | X | X | X |
| COMBINED READ + SHORT ERASURE | 0 | 0 | X | X | X | X | X | X | X | X |

FIG. 6

ERROR DETECTION AND CORRECTION IN MEMORY

TECHNICAL FIELD

The present disclosure relates generally to semiconductor memory and methods, and more particularly, error detection and correction in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

The present disclosure includes apparatuses, methods, and systems for error detection and correction in memory. An embodiment includes a memory having a group of self-selecting memory cells which store data corresponding to a codeword from some error correcting code, and circuitry configured to perform a sense operation on the group of self-selecting memory cells, identify, based on the sense operation, memory cells of the group that cannot store data, mark data sensed from the identified memory cells as erasures and perform an error correction operation on data sensed from the group of self-selecting memory cells with the data sensed from the identified memory cells marked as erasures.

During the sensing of a resistance variable memory cell, such as a self-selecting memory cell, a voltage may be applied to the memory cell, and the data state of the cell can be determined based on the amount of current that flows through the cell in response to the applied voltage. For example, when the voltage is applied to the memory cell, the resulting amount of current that is on a signal line (e.g., bit line or word line) to which the memory cell is coupled can be compared to a reference current, and the state of the memory cell can be determined based on the comparison. For instance, the cell can be determined to be in a first (e.g., reset) data state if the comparison indicates the signal line current is less than the reference current, and the cell can be determined to be in a second (e.g., set) data state if the comparison indicates the signal line current is greater than the reference current.

During operation of a memory, however, various mechanisms, such as, for instance, read disturb, can cause the memory cells to be determined (e.g., sensed) to be in a different data state than the state to which the cells were actually programmed. For instance, a memory cell that is programmed to the first data state may erroneously be sensed to be in the second data state, indicating an error within the selected memory cell. Such erroneous data sensing can reduce the performance and/or lifetime of the memory, and may be more severe in memory having an increased memory cell density.

Certain mechanisms can cause a memory cell to persistently be sensed as one state or the other, independent of the prior programming operation to that cell. For instance, memory cells on a line which is shorted to an adjacent line will always be sensed in the same state independent of any programming operations, although the sensed data state will depend on how the shorted line is connected to the sensing circuitry. Memory cells impacted by such mechanisms are incapable of storing data.

Operations can be performed to detect and correct such errors in sensed data. Such operations utilize redundant bits in addition to the information bits to generate a codeword. Error correction is performed on a received word in order to recover the original codeword and the presence of redundant bits enables the decoding algorithm to recover the original information bits even if some number of the information or redundant bits were corrupted. As the amount of errors in the sensed data increases, however, the correction rate of such operations may not be high enough to be able to correct the errors, and the correction operations may fail. Increasing the correction rate of the correction operation without changing the algorithm of the operation or reducing the amount of data on which the operation is performed, however, can be difficult.

Embodiments of the present disclosure, however, can increase error correction capability by identifying memory cells that have failed and using this knowledge when performing the error correction operation. For example, during a failure identification operation, certain memory cells can be identified as being unable to store data. The location corresponding to these memory cells within a received word are marked as erasures. The erasures may occur as a result of a short within the memory cell, for example. An error correction operation can then be performed on the received word to correct for the presence of erasures, and possibly other bit errors, and recover the codeword and information bits contained within. Identifying and using the erasures in such a manner can increase the correction capabilities (e.g., the raw bit error rate) of the error correction operation compared to the same error correction operation without knowledge of the erasure locations.

Embodiments of the present disclosure can utilize several methods to identify and use erasures. For instance, one method can include performing a secondary sense operation and comparing the information obtained in the secondary sense operation to that from a prior sense operation. Another method can include using a sense amplifier with a check signal to detect snapback from the memory cells. This method can use sensing circuitry and system changes to identify an erasure and mark the erasure. Another method can include performing a bipolar sense operation in which two consecutive sensing voltages of opposite polarities can be applied to a memory cell. For example, a sensing voltage with a positive polarity may be applied to a memory cell and then a sensing voltage with a negative polarity can be applied to the same cell, and the resulting data from both polarities can be compared.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

Figure 1:
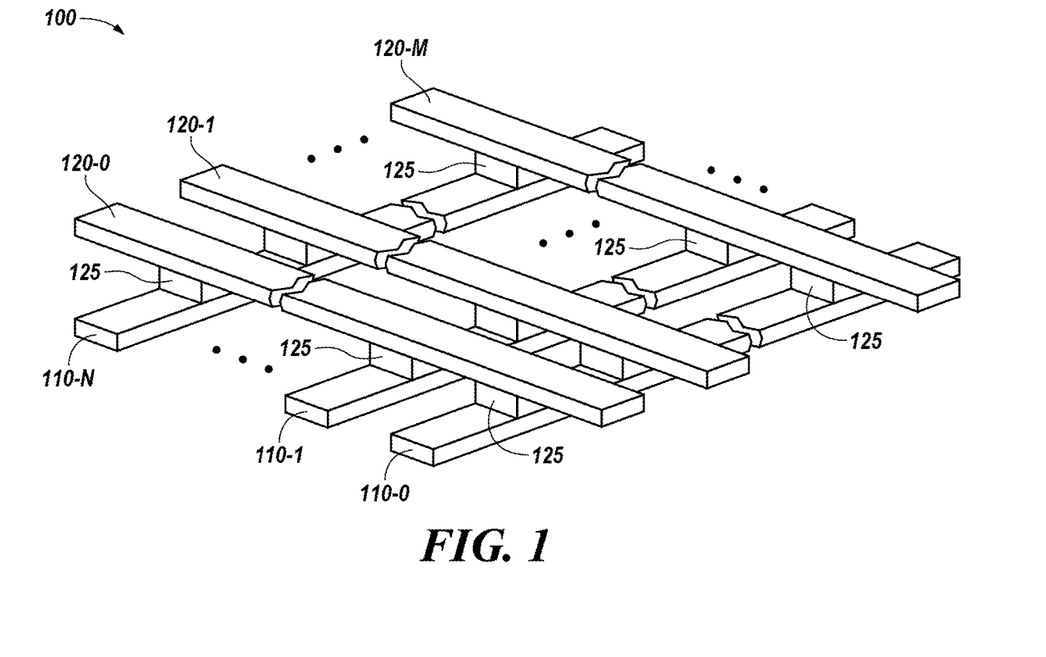
FIG. 1 is a three-dimensional view of an example of a memory array, in accordance with an embodiment of the present disclosure.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality of second signal lines (e.g., second access lines), which may be referred to as bit lines 120-0 to 120-M) that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different data states. In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include GexTey, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example. In some examples, a snap can count as an erasure.

The architecture of memory array 100 may be referred to as a cross-point architecture in which a memory cell is formed at a topological cross-point between a word line and a bit line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures.

Embodiments of the present disclosure, however, are not limited to the example memory array architecture illustrated in FIG. 1. For example, embodiments of the present disclosure can include a three-dimensional memory array having a plurality of vertically oriented (e.g., vertical) access lines and a plurality of horizontally oriented (e.g., horizontal) access lines. The vertical access lines can be bit lines arranged in a pillar-like architecture, and the horizontal access lines can be word lines arranged in a plurality of conductive planes or decks separated (e.g., insulated) from each other by a dielectric material. The chalcogenide material of the respective memory cells of such a memory array can be located at the crossing of a respective vertical bit line and horizontal word line.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
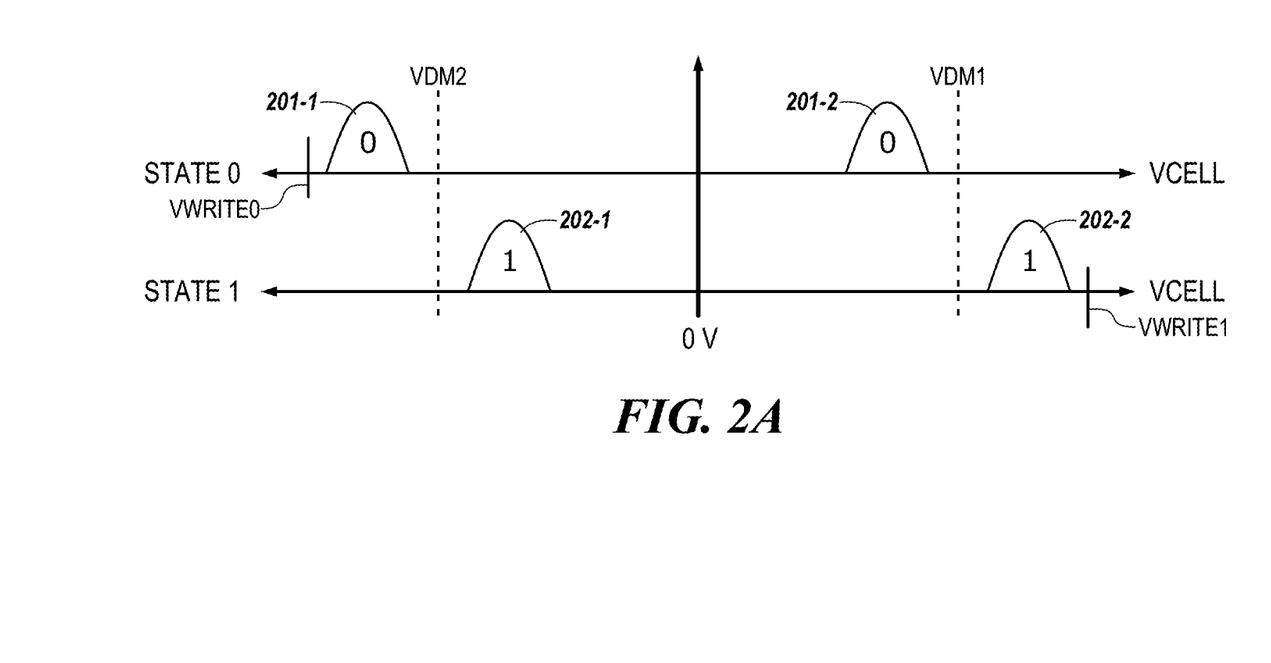
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of two possible data states (e.g., state 0 or state 1). That is, FIG. 2A illustrates threshold voltage distributions associated with two possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 201-1, 201-2, 202-1, and 202-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
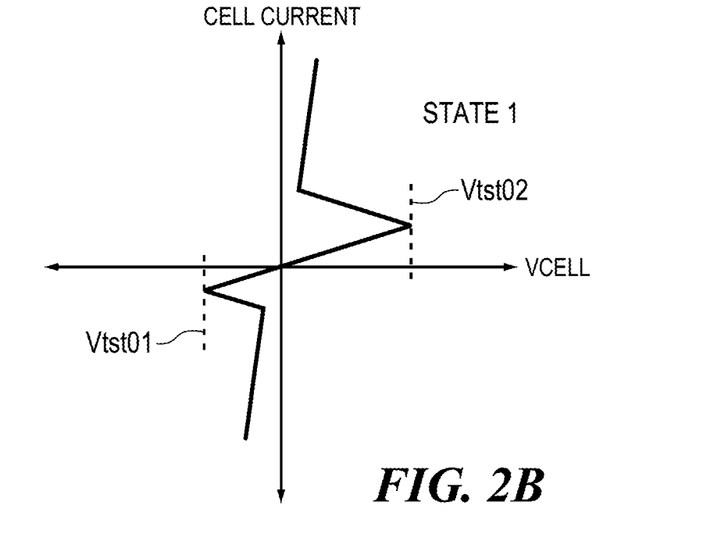
FIG. 2B is an example of a current-versus-voltage curve corresponding to a memory state of FIG. 2A, in accordance with an embodiment of the present disclosure.
Figure 2C:
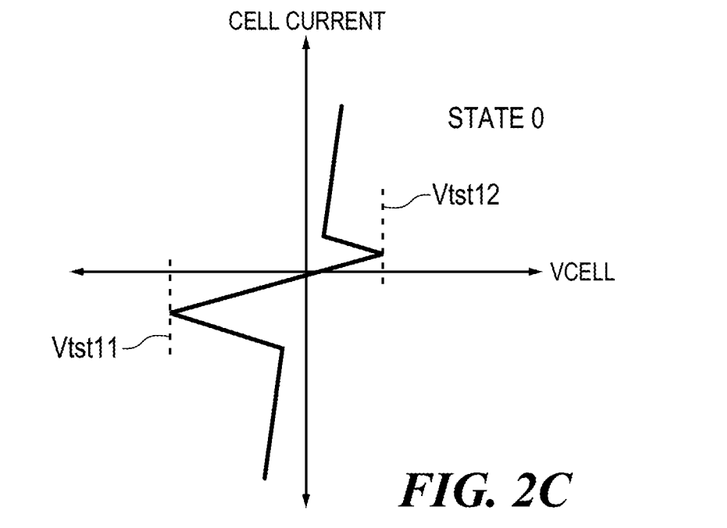
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to a reset state (e.g., state 0) or a set state (e.g., state 1) may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 201-1 and 201-2) whose magnitude is greater for a negative polarity than a positive polarity, and a second data state (e.g., state 1) is associated with a second asymmetric threshold voltage distribution (e.g., threshold voltage distributions 202-1 and 202-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 201-2) from cells in state 1 (e.g., threshold voltage distribution 202-2). Similarly, VDM2 is a negative voltage used to distinguish cells in state 1 (e.g., threshold voltage distribution 202-1) from cells in state 0 (e.g., threshold voltage distribution 201-1). In the examples of FIGS. 2A-2C, a memory cell 125 in a positive state 1 does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 does not snap back in response to applying VDM2.

Embodiments are not limited to the example shown in FIG. 2A. For example, the designations of state 0 and state 1 can be interchanged (e.g., distributions 201-1 and 201-2 can be designated as state 1 and distributions 202-1 and 202-2 can be designated as state 0). The VDMs described herein may be used in bipolar sense operations (as described in FIG. 2A) and/or in unipolar sense operations. In a unipolar sense operation, the VDMs may be in the same polarity but have different magnitudes.

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 200-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 202-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event can be used to write a cell to the opposite state (e.g., from state 1 to state 0 and vice versa).

As memory cells 125 are repeatedly programmed (e.g., written) and sensed (e.g., read), the magnitudes of their snapback voltages (e.g., Vtst 01, Vtst 02, Vtst11, and Vtst12) may change due to the stress caused by continuously applying the programming and sensing voltages to the electrodes of the cells, which in turn may make it easier or more difficult for the cells to snap back. This can cause a selected cell in a sense operation to be sensed to be in a different data state than the state to which the cell was actually programmed. For instance, a memory cell that is programmed to the reset state (e.g., state 0) may erroneously be sensed to be in the set state (e.g., state 1). Such an error can be corrected using an error correction operation, as will be further described herein.

Figure 3:
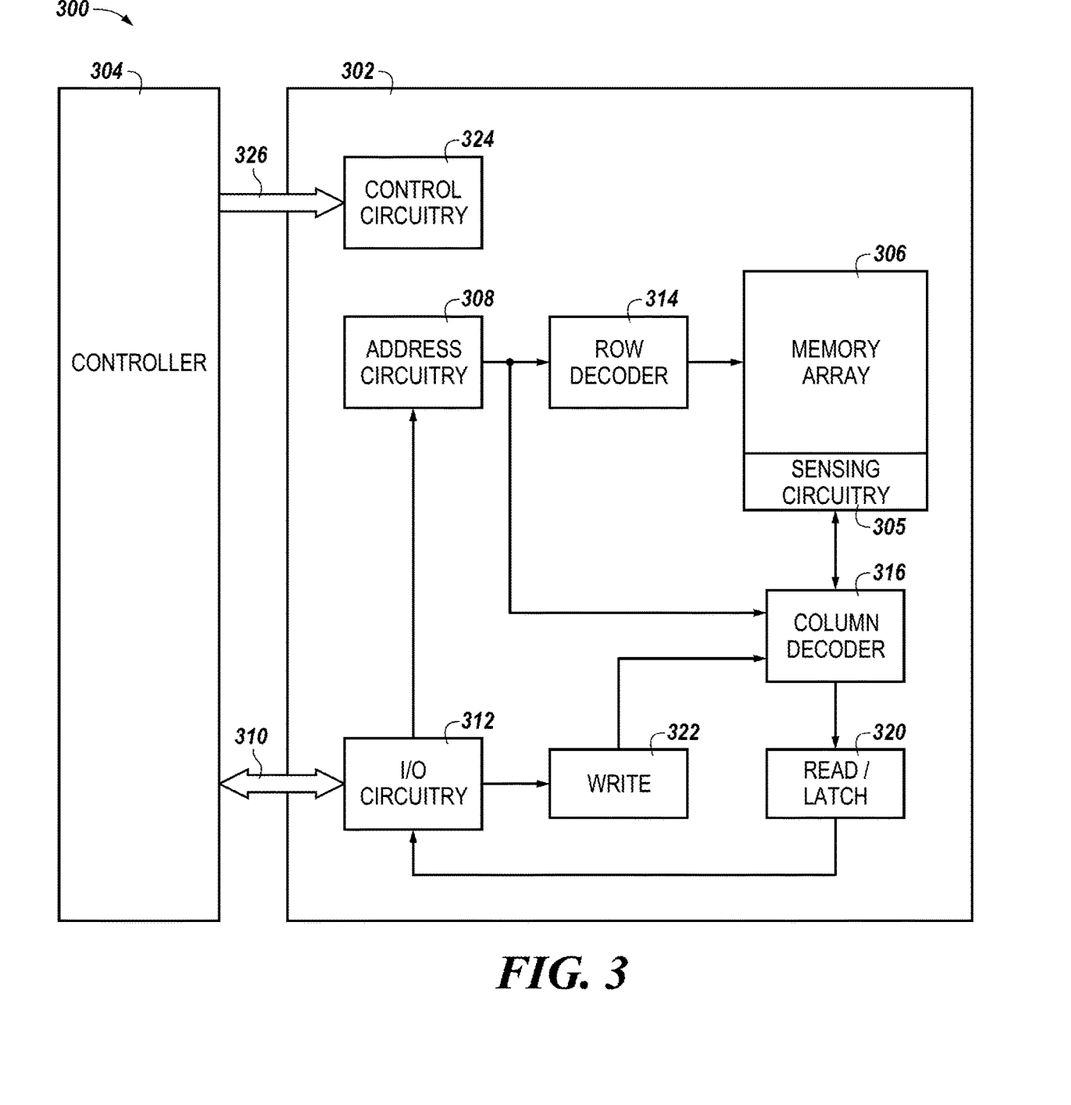
FIG. 3 is a block diagram illustration of an example apparatus, in accordance with an embodiment of the present disclosure.

FIG. 3 is a block diagram illustration of an example apparatus, such as an electronic memory system 300, in accordance with an embodiment of the present disclosure. Memory system 300 may include an apparatus, such as a memory device 302 and a controller 304, such as a memory controller (e.g., a host controller). Controller 304 might include a processor, for example. Controller 304 might be coupled to a host, for example, and may receive command signals (or commands), address signals (or addresses), and data signals (or data) from the host and may output data to the host.

Memory device 302 includes a memory array 306 of memory cells. For example, memory array 306 may include one or more of the memory arrays, such as a cross-point array, of memory cells disclosed herein. Memory device 302 may include address circuitry 308 to latch address signals provided over I/O connections 310 through I/O circuitry 312. Address signals may be received and decoded by a row decoder 314 and a column decoder 316 to access the memory array 306. For example, row decoder 314 and/or column decoder 316 may include drivers.

Memory device 302 may sense (e.g., read) data in memory array 306 by sensing voltage and/or current changes in the memory array columns using sense/buffer circuitry that in some examples may include read/latch circuitry 320 and/or sensing circuitry 305. Read/latch circuitry 320 may read and latch data from the memory array 306. Sensing circuitry 305 may include a number of sense amplifiers coupled to memory cells of memory array 306, which may operate in combination with the read/latch circuitry 320 to sense (e.g., read) memory states from targeted memory cells, as will be further described herein. I/O circuitry 312 may be included for bi-directional data communication over the I/O connections 310 with controller 304. Write circuitry 322 may be included to write data to memory array 306.

Control circuitry 324 may decode signals provided by control connections 326 from controller 304. These signals may include chip signals, write enable signals, and address latch signals that are used to control the operations on memory array 306, including data read and data write operations.

Control circuitry 324 may be included in controller 304, for example. Controller 304 may include other circuitry, firmware, software, or the like, whether alone or in combination. Controller 304 may be an external controller (e.g., in a separate die from the memory array 306, whether wholly or in part) or an internal controller (e.g., included in a same die as the memory array 306). For example, an internal controller might be a state machine or a memory sequencer.

In some examples, controller 304 may be configured to identify memory cells of memory array 306 that have failed, and use this knowledge when performing error correction operations on data sensed from memory array 306 to increase the correction capability of the operations. For example, controller 304 can perform a sense operation on a group of the memory cells of the memory array 306, and identify, based on the sense operation, memory cells of the group that cannot store data.

In one example, the memory cells that cannot store data may not be able to store data as a result of a short associated with the memory cell. In another example, the memory cells that cannot store data may not be able to store data as a result of a data line leakage associated with the memory cell.

In some examples, the memory cells may be a group of self-selecting memory cells. Each of the memory cells may include a single material, between a top electrode (e.g., top plate) and a bottom electrode (e.g., bottom plate), that may serve as a select element (e.g., a switching material) and a storage element, so that each memory cell may act as both a selector device and a memory element, as previously described herein. Further, the group of memory cells can be a page of memory cells of array 306 that stores a codeword data pattern. For example, memory array 306 can be divided into addressable groups of memory cells that can be programmed in response to program (e.g., write) commands that address the groups and that can be sensed in response to sense (e.g., read) commands that address the groups. In some examples, the groups of memory cells can have a physical address that corresponds to a logical address received from a host. Controller 304 can include a logical-to-physical (L2P) mapping component that can map the logical addresses from the host to the physical addresses of the groups of memory cells. The groups of memory cells can be pages corresponding to the logical addresses. For example, each group can store a data pattern (e.g., a data structure) that can be referred to as a managed unit, such as a codeword.

After identifying the memory cells of the group that cannot store data, controller 304 can mark any data sensed from these cells as erasures, and any error correction operation performed by controller 304 on data sensed from the group of memory cells can be performed with the data sensed from the identified memory cells marked as erasures.

The error correction operation may be performed using error correction codes such as Hamming codes, Reed-Solomon (RS) codes, Bose-Chaudhuri-Hochquenghem (BCH) codes, circular redundancy check (CRC) codes, Golay codes, Reed-Muller codes, Goppa codes, neighbor-cell assisted error correction codes, low density parity check (LDPC) error correction codes, and Denniston codes, and/or other type of error correction codes for instance, which can facilitate error correction. For instance, the controller 304 may use a BCH algorithm to perform the error correction operation. Performing the error correction operation with the data sensed from the memory cells marked as erasures may increase the error correction rate of the error correction operation.

In one embodiment, controller 304 can perform a first sense operation on a group of self-selecting memory cells to sense data from the group of self-selecting memory cells. The data sensed during the first sense operation can be transmitted to controller 304 as standard data. Controller 304 can then perform a second sense operation on the group of memory cells after the first sense operation to identify memory cells of the group that cannot store data. For instance, the second sense operation may be performed to detect shorts within the memory cells of the group (e.g., any cells of the group in which a short is detected can be identified as a memory cell that cannot store data). Controller 304 can mark the data sensed from the identified cells of the group (e.g., the cells that cannot store data) as erasures, and perform an error correction on the data sensed from the group of cells with the data sensed from the identified cells marked as erasures.

In one example, the second sense operation can include applying a first voltage to the sense lines to which the memory cells are coupled and applying a second voltage having a magnitude that is less than a magnitude of the first voltage to the access lines to which the memory cells are coupled. In another example, the second sense operation can include applying a first voltage to the sense lines to which the memory cells are coupled and applying a second voltage having the same magnitude as a magnitude of the first voltage to the access lines to which the memory cells are coupled. For instance, the second sense operation can use the same sense voltage as the first sense operation.

In another embodiment, controller 304 can perform a sense operation on the group of self-selecting memory cells to sense data from the group of self-selecting memory cells and to identify memory cells of the group that cannot store data. Controller 304 can mark data sensed from the cells of the group identified as being unable to store data as erasures. Controller 304 can perform an error correction operation on the data sensed from the group of cells with the data sensed from the identified cells marked as erasures.

As an example, a sense amplifier with a check signal within the sensing circuitry 305 may be used to detect snapback of the memory cells. The memory cells of the group that cannot store data may be identified based on binary data from a check status latch coupled to the sense amplifier. In this example, the location in the memory of the cells of the group that cannot store data can also be identified. The sense operation can be performed by grounding the access lines to which the memory cells are coupled and charging the access lines after grounding the access lines. During the sense operation, all data sensed is marked as being in a first data state (e.g., 0), and data sensed from the memory cells that are identified as being unable to store data are marked as being in a second data state (e.g., 1). An example of such a sense amplifier and sense operation will be further described herein (e.g., in connection with FIG. 5).

In another embodiment, controller 304 can perform a bipolar sense operation on a group of self-selecting memory cells to identify memory cells of the group that cannot store data, mark data sensed from the cells identified as being unable to store data as erasures, and perform an error correction operation on the data sensed from the identified memory cells marked as erasures. The bipolar sense operation can include performing two consecutive read operations on the group of memory cells in opposite polarities (e.g., using two sensing voltages of opposite polarities). The bipolar sense operation may be used to detect shorts associated with the memory cells (e.g., any cell detected by the bipolar sense operation to have a short associated therewith can be identified as a cell that cannot store data). For example, a memory cell may be identified as being unable to store data when the memory cell is sensed to be in a same data state in both consecutive reads (e.g., if the two consecutive opposite sensing voltage polarities produce the same data state in a memory cell). The bipolar sense operation can include performing the first read of the two consecutive reads using a first voltage and performing the second read of the two consecutive reads using a second voltage having an opposite polarity from the first voltage and a magnitude that is less than a magnitude of the first voltage. An example of an error detection table that can be used in conjunction with such a bipolar sense operation to identify memory cells that cannot store data will be further described herein (e.g., in connection with FIG. 6).

In an example, an additional sense operation may be performed as a standard sense operation to identify the cells of the group that cannot store data. In one embodiment, the additional sense operation may be performed prior to performing the bipolar sense operation. In another embodiment, the additional sense operation may be performed after performing the bipolar sense operation.

Figure 4:
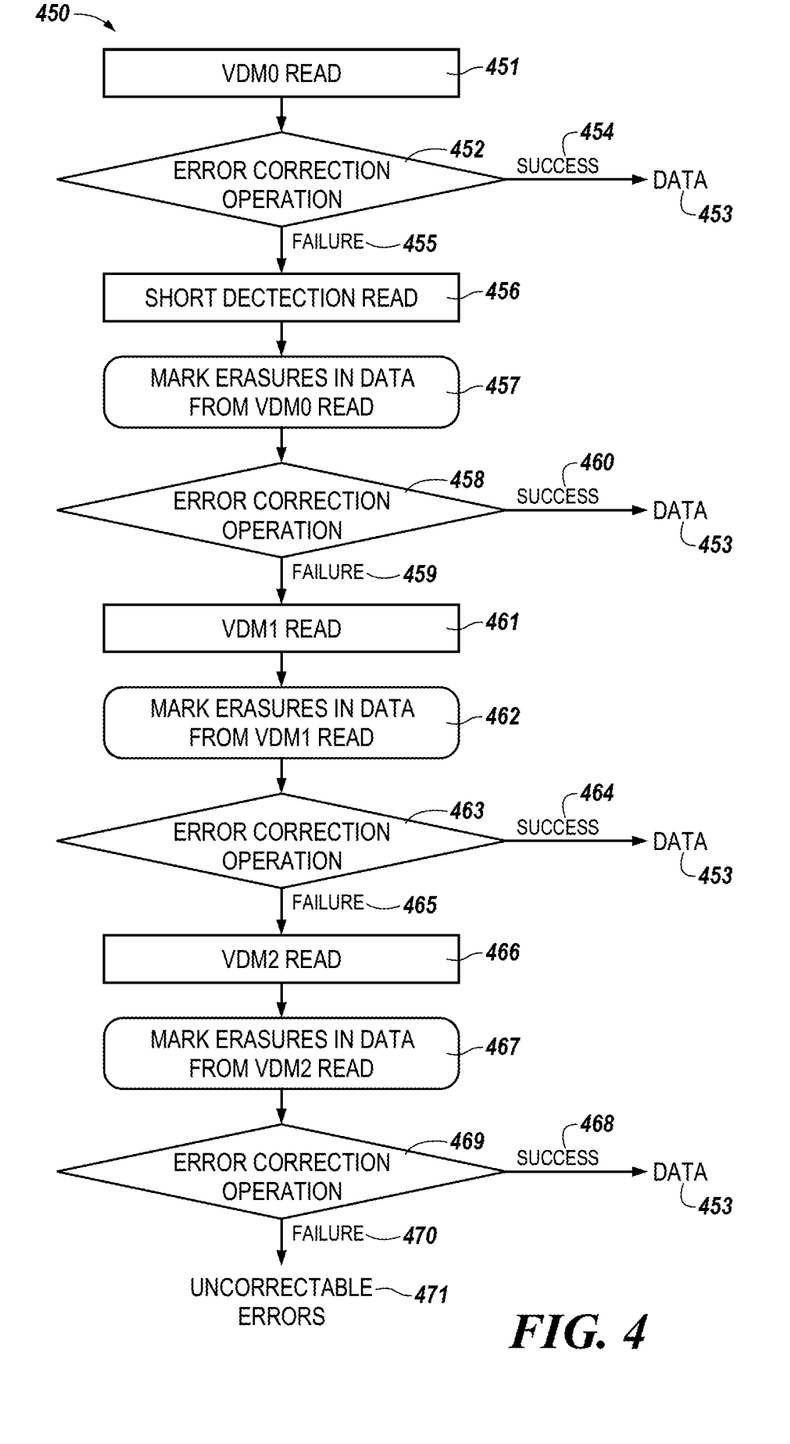
FIG. 4 is a flow chart of an example method for error detection and correction, in accordance with an embodiment of the present disclosure.

FIG. 4 is a flow chart of an example method 450 for error detection and correction, in accordance with an embodiment of the present disclosure. Method 450 can be performed by, for example, controller 304 of FIG. 3.

At block 451 of method 450, a sense (e.g., read) operation is performed. The sense operation can be performed using a first demarcation voltage (e.g., VDM0) applied to a group of self-selecting memory cells, as previously described herein.

At block 452 of method 450, an initial error correction operation can be performed on the data sensed during the sense operation. The error correction operation can be performed using an error correction code. The error correction code could be BCH code. For example, a BCH algorithm can be used to perform the error correction operation. If the error correction operation is successful at 454, there is unhindered access to the data 453 stored within the memory cells. If the error correction operation is unsuccessful (e.g., fails) 455, a sense (e.g., read) operation to detect memory cells that cannot store data as a result of a short in the memory cell can be performed at block 456.

At block 457 of method 450, memory cells of the group that cannot store data are identified, and data sensed from these memory cells during the sense operation performed using the first demarcation voltage (e.g., VDM0) may be marked as erasures. At block 458 of method 450, a subsequent error correction operation can be performed on the data sensed during the sense operation (e.g., using the BCH algorithm), with the data sensed from the cells identified at block 457 marked as erasures. If the error correction operation is successful at 460, there is unhindered access to the data 453 stored within the memory cells. If the error correction operation is unsuccessful (e.g., fails) 459, a subsequent sense (e.g., read) operation can be performed at block 461 to detect memory cells that cannot store data as a result of a short in the memory cell. The subsequent sense operation can be performed using a second demarcation voltage (e.g., VDM1).

At block 462 of method 450, memory cells of the group that cannot store data are identified, and data sensed from these memory cells during the sense operation performed using second demarcation voltage (e.g., VDM1) may be marked as erasures. At block 463 of method 450, a subsequent error correction can be performed on the data sensed during the sense operation (e.g., using the BCH algorithm), with the data sensed from the cells identified in block 462 marked as erasures. If the error correction operation is successful at 464, there is unhindered access to the data 453 stored within the memory cells. If the error correction operation is unsuccessful (e.g., fails) 465, a subsequent sense (e.g., read) operation can be performed at block 466 to detect memory cells that cannot store data as a result of a short within the memory cell. The subsequent sense operation can be performed using a third demarcation voltage (e.g., VDM2).

At block 467 of method 450, memory cells of the group that cannot store data are identified, and data sensed from these memory cells during the sense operation performed using the third demarcation voltage (e.g., VDM2) may be marked as erasures. At block 469 of method 450, a subsequent error correction operation can be performed on the data sensed during the sense operation (e.g., using the BCH algorithm), with the data sensed from the cells identified in block 467 marked as erasures. If the error correction operation is successful at 468, there is unhindered access to the data 453 stored within the memory cells. If the error correction operation is unsuccessful (e.g., fails) 470, the errors in the data are deemed uncorrectable errors 471.

Figure 5:
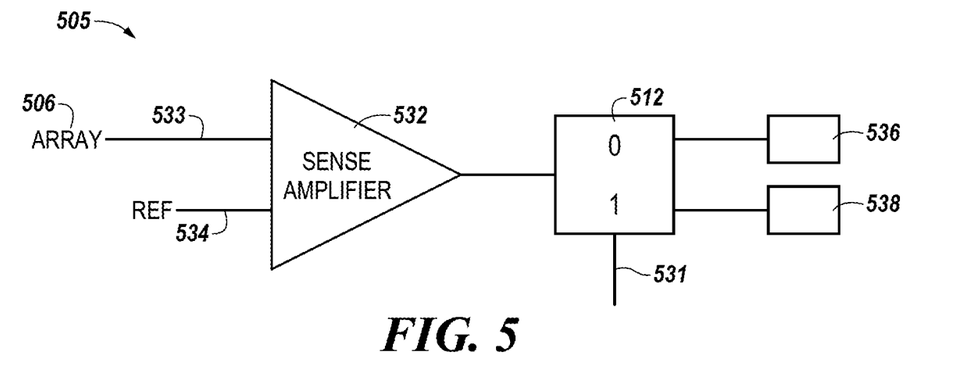
FIG. 5 illustrates example sensing circuitry, in accordance with an embodiment of the present disclosure.

FIG. 5 illustrates example sensing circuitry 505, in accordance with an embodiment of the present disclosure. Sensing circuitry 505 can be, for instance, sensing circuitry 305 previously described in connection with FIG. 3.

As shown in FIG. 5, sensing circuitry 505 can include a sense amplifier 532. Although a single sense amplifier 532 is illustrated in FIG. 5 for simplicity and so as not to obscure embodiments of the present disclosure, sensing circuitry 505 (e.g., sensing circuitry 305) can include any number of sense amplifiers analogous to sense amplifier 532.

Sense amplifier 532 can be used to perform a sense operation on a group of self-selecting memory cells to sense data from the group of self-selecting memory cells and to identify memory cells of the group that cannot store data. During the sense operation, a demarcation voltage (e.g., VDM1 and/or VDM 2) can be applied to the memory cell, as previously described herein. In response to the application of the demarcation voltage, a current may flow through the cell and on the signal (e.g., access) line 533 to which the cell is coupled, as previously described herein. The access line (e.g., bit line) 533 can be coupled to sense amplifier 532 to input this current, represented as array 506, into sense amplifier 532, as shown in FIG. 5. In some examples, the access line 533 may be coupled to the memory array (e.g., memory array 306), to be coupled to the relevant memory cells. In one embodiment, the sense operation can be performed by charging access line 533 while the word lines of the array are grounded or held at a very low voltage relative to the voltage to which access line 533 is charged.

Sense amplifier 532 can compare the magnitude of the current on the access line to the magnitude of reference current 534 shown in FIG. 5, and the result of the comparison is output into a demultiplexer 512 prior to being sent to latches 536 and 538. One of the latches (e.g., latch 536) may be a data latch, which can indicate the data state of the cell, and the other one of the latches (e.g., latch 538) can be a check status latch, which can indicate whether the cell cannot store data (e.g., the memory cells that cannot store data may be identified based on binary data from the check status latch). For instance, if the output of sense amplifier 532 (e.g., the result of the comparison) indicates the magnitude of access line 533 is less than reference line 534, the memory cell can be determined to be in a first (e.g., reset) data state, and if the output of the sense amplifier 532 indicates the magnitude of access line 533 is greater than reference line 534, the memory cell can be determined to be in a second (e.g., set) data state. This result can be latched in the data latch. Further, during the sense operation, all data sensed can be marked as being in a first data state (e.g., 0) in the check status latch, and memory cells that are identified as being unable to store data may be marked as being in a second data state (e.g., 1) in the check status latch. For instance, the demultiplexer 512 may be coupled to a check signal line 531 which can be used to detect snapback from the memory cells, and the result can be latched in the check status latch. The use of sensing circuitry 505 can identify the cells that cannot store data based on data from the check status latch and also the location of those cells within the memory using the access line to determine where the sensed memory cell is located.

Figure 6:
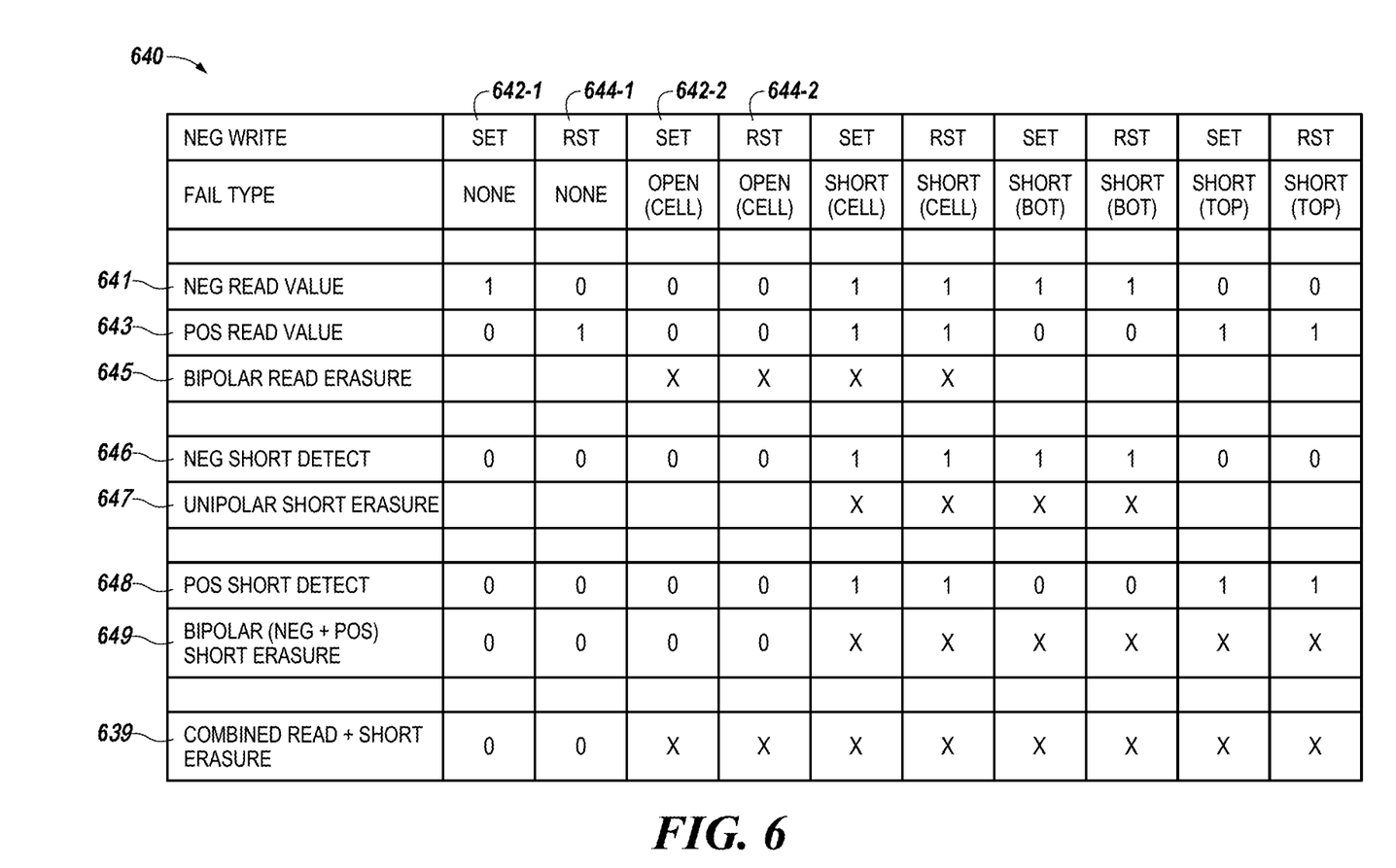
FIG. 6 illustrate an example of an error detection table, in accordance with an embodiment of the present disclosure.

FIG. 6 illustrates an example of an error detection table 640, in accordance with an embodiment of the present disclosure. For instance, error detection table 640 can be used in conjunction with a bipolar sense operation to identify memory cells that cannot store data. The upper portion of the table 640 illustrates the possible results (e.g., possible data states) of a bipolar sense operation with two sense operations (641 and 643) performed using sensing voltages of opposite polarities. For instance, the negative sense operation 641 lists its possible results while the positive sense operation 643 lists its possible results.

Bipolar erasures 645 may identify cells that are unable to store data when the memory cell is sensed to be in a same data state in both consecutive reads. For example, if the two consecutive opposite polarity reads produce the same data state (e.g., both produce 0 or both produce 1) in a memory cell, as illustrated in set state 642-2 and reset state 644-2, the cell can be identified as being unable to store data. However, if the two consecutive opposite polarity reads produce different data states (e.g., one produces 0 and the other produces 1), as illustrated in set state 642-1 and reset state 644-1, the cell is able to store data. As such, the bipolar sense operation may be used to detect shorts within the memory cells for both sense operations in opposite polarities, as illustrated in FIG. 6.

Error detection table 640 can also be used in conjunction with a unipolar sense operation (e.g., a sense operation that uses sensing voltages of a single polarity) to identify memory cells that cannot store data. Row 646 of the table 640 illustrates possible data states from a first sense operation using a negative polarity to be set as the standard data. Unipolar erasures 647 can identify cells that cannot store data. For example, if a unipolar sense operation produces a data state of 1, the cell can be identified as being unable to store data. Row 648 of the table 640 illustrates possible data states from a first sense operation using a positive polarity to be set as the standard data. Bipolar short erasures 649 can identify cells that cannot store data. Further, multiple sense operations can be conducted such that combined erasure 639 can identify cells that cannot store data based on data sensed using sense operations of opposite polarities.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory having a group of self-selecting memory cells which store data corresponding to a codeword from an error correcting code; and
   circuitry configured to:
   perform a sense operation on the group of self-selecting memory cells by activating a sense amplifier with a check signal to detect a snapback of the self-selecting memory cells of the group;
   identify, based on the sense operation, memory cells of the group that cannot store data;
   mark data sensed from the identified memory cells as erasures; and
   perform an error correction operation on data sensed from the group of self-selecting memory cells with the data sensed from the identified memory cells marked as erasures.

2. The apparatus of claim 1, wherein each of the self-selecting memory cells comprise a single material that serves as a select element and a storage element.

3. The apparatus of claim 1, wherein the circuitry is configured to perform the error correction operation using a Bose-Chaudhuri-Hocquenghem (BCH) algorithm.

4. The apparatus of claim 1, wherein the identified memory cells that cannot store data have a short associated therewith.

5. The apparatus of claim 1, wherein the identified memory cells that cannot store data have a data line leakage associated therewith.

6. The apparatus of claim 1, wherein an error correction rate of the error correction operation is increased by performing the error correction operation with the data sensed from the identified memory cells marked as erasures.

7. A method of operating memory, comprising:
   performing a first sense operation on a group of self-selecting memory cells comprising a word to sense data from the group of self-selecting memory cells;
   performing a second sense operation on the group of self-selecting memory cells after the first sense operation to identify memory cells of the group that cannot store data;
   marking bits in the word corresponding to the identified memory cells of the group as erasures; and
   performing an error correction operation on the data sensed from the group of self-selecting memory cells using a location of the bits in the word marked as erasures.

8. The method of claim 7, wherein performing the second sense operation includes:
   applying a first voltage to sense lines to which the group of self-selecting memory cells are coupled; and
   applying a second voltage having a magnitude that is less than a magnitude of the first voltage to access lines to which the group of self-selecting memory cells are coupled.

9. The method of claim 7, further comprising transmitting the data sensed from during the first sense operation to a controller as standard data.

10. The method of claim 7, wherein performing the second sense operation detects shorts associated with the identified memory cells of the group.

11. The method of claim 7, further comprising performing the first sense operation and the second sense operation using a same sense circuitry.

12. An apparatus comprising:
    a memory having a group of self-selecting memory cells; and
    circuitry configured to:
    perform a sense operation on the group of self-selecting memory cells to:
    sense data from the group of self-selecting memory cells; and
    identify memory cells of the group that cannot store data based on binary data from a check status latch;
    mark the data sensed from the identified memory cells of the group as erasures; and
    perform an error correction operation on the data sensed from the group of self-selecting memory cells with the data sensed from the identified memory cells of the group marked as erasures.

13. The apparatus of claim 12, wherein the circuitry is configured to perform the sense operation by activating a sense amplifier with a check signal to detect a snapback of the self-selecting memory cells.

14. The apparatus of claim 12, wherein the circuitry is configured to identify a location in the memory of the memory cells of the group that cannot store data.

15. The apparatus of claim 12, wherein the circuitry is configured to perform the sense operation by:

grounding access lines to which the group of self-selecting memory cells are coupled; and charging the access lines after grounding the access lines.

16. The apparatus of claim 12, wherein the circuitry is configured to:

mark the data sensed from the group of self-selecting memory cells as a first data state; and mark the data sensed from the identified memory cells of the group that cannot store data as a second data state.

17. A method of operating memory, comprising:

performing a bipolar sense operation on a group of self-selecting memory cells to identify memory cells of the group that cannot store data;

marking data sensed from the identified memory cells of the group as erasures; and performing an error correction operation on the data sensed from the group of self-selecting memory cells with the data sensed from the identified memory cells marked as erasures.

18. The method of claim 17, wherein performing the bipolar sense operation comprises performing two consecutive reads of the group of self-selecting memory cells in opposite polarities.

19. The method of claim 18, further comprising identifying memory cells that are sensed to be in a same data state in both consecutive reads as memory cells that cannot store data.

20. The method of claim 18, wherein performing the bipolar sense operation includes:

performing a first read of the two consecutive reads using a first voltage; and performing a second read of the two consecutive reads using a second voltage having an opposite polarity from the first voltage and a magnitude that is less than a magnitude of the first voltage.

21. The method of claim 17, wherein the bipolar sense operation detects shorts associated with the identified memory cells of the group.

22. The method of claim 17, further comprising performing an additional sense operation prior to performing the bipolar sense operation to identify memory cells of the group that cannot store data.

23. The method of claim 17, further comprising performing an additional sense operation after performing the bipolar sense operation to identify memory cells of the group that cannot store data.

* * * * *